(12) United States Patent
Althaus et al.

(10) Patent No.: US 6,853,657 B2
(45) Date of Patent: Feb. 8, 2005

(54) METHOD AND DEVICE FOR DETERMINING THE OUTPUT POWER OF A SEMICONDUCTOR LASER DIODE

(75) Inventors: Hans-Ludwig Althaus, Lappersdorf (DE); Gerhard Kuhn, Köfering (DE)

(73) Assignee: Infineon Technologies AG, Munich (DE)

( * ) Notice: Subject to any disclaimer, the term of this patent is extended or adjusted under 35 U.S.C. 154(b) by 157 days.

(21) Appl. No.: 10/364,003

(22) Filed: Feb. 10, 2003

(65) Prior Publication Data

US 2003/0156606 A1 Aug. 21, 2003

Related U.S. Application Data

(63) Continuation of application No. PCT/DE01/02998, filed on Aug. 8, 2001.

(30) Foreign Application Priority Data

Aug. 8, 2001 (DE) .......................................... 100 42 022

(51) Int. Cl.[7] .............................................. H01S 3/00
(52) U.S. Cl. ...................................... 372/38.02; 372/33
(58) Field of Search ........................... 372/38.1–38.09, 372/29.01–34

(56) References Cited

U.S. PATENT DOCUMENTS

| | | | |
|---|---|---|---|
| 4,683,573 A | 7/1987 | Albanese | ...................... 372/34 |
| 5,414,280 A | 5/1995 | Girmay | ........................ 257/80 |
| 5,736,769 A * | 4/1998 | Nishiura et al. | ............. 257/368 |
| 6,356,774 B1 * | 3/2002 | Bernstein et al. | ............ 600/323 |

FOREIGN PATENT DOCUMENTS

| | | | |
|---|---|---|---|
| DE | 36 03 548 A1 | 10/1986 | ........... H01S/3/133 |
| DE | 195 02 252 A1 | 7/1995 | ......... H01L/31/173 |
| DE | 198 39 088 A1 | 3/2000 | ........... H01S/5/068 |
| EP | 1 039 597 A2 | 9/2000 | ........... H01S/5/068 |
| GB | 2 224 374 A | 5/1990 | ........... H01S/3/133 |

* cited by examiner

*Primary Examiner*—Quyen Leung
(74) *Attorney, Agent, or Firm*—Laurence A. Greenberg; Werner H. Stemer; Ralph E. Locher

(57) ABSTRACT

The invention relates to a method and device for determining the output power of a semiconductor laser diode being operated with a diode current. A defined measuring current, which is less than the threshold current of the semiconductor laser diode, is conducted in a conducting direction through the semiconductor laser diode. The forward voltage drop across the semiconductor laser diode is measured, and the temperature of the laser-active region of the semiconductor laser diode is determined from the measured forward voltage by using at least one calibration curve. The invention makes a simple and precise determination of the output power possible without requiring an additional measuring device, for example, a monitor diode.

13 Claims, 6 Drawing Sheets

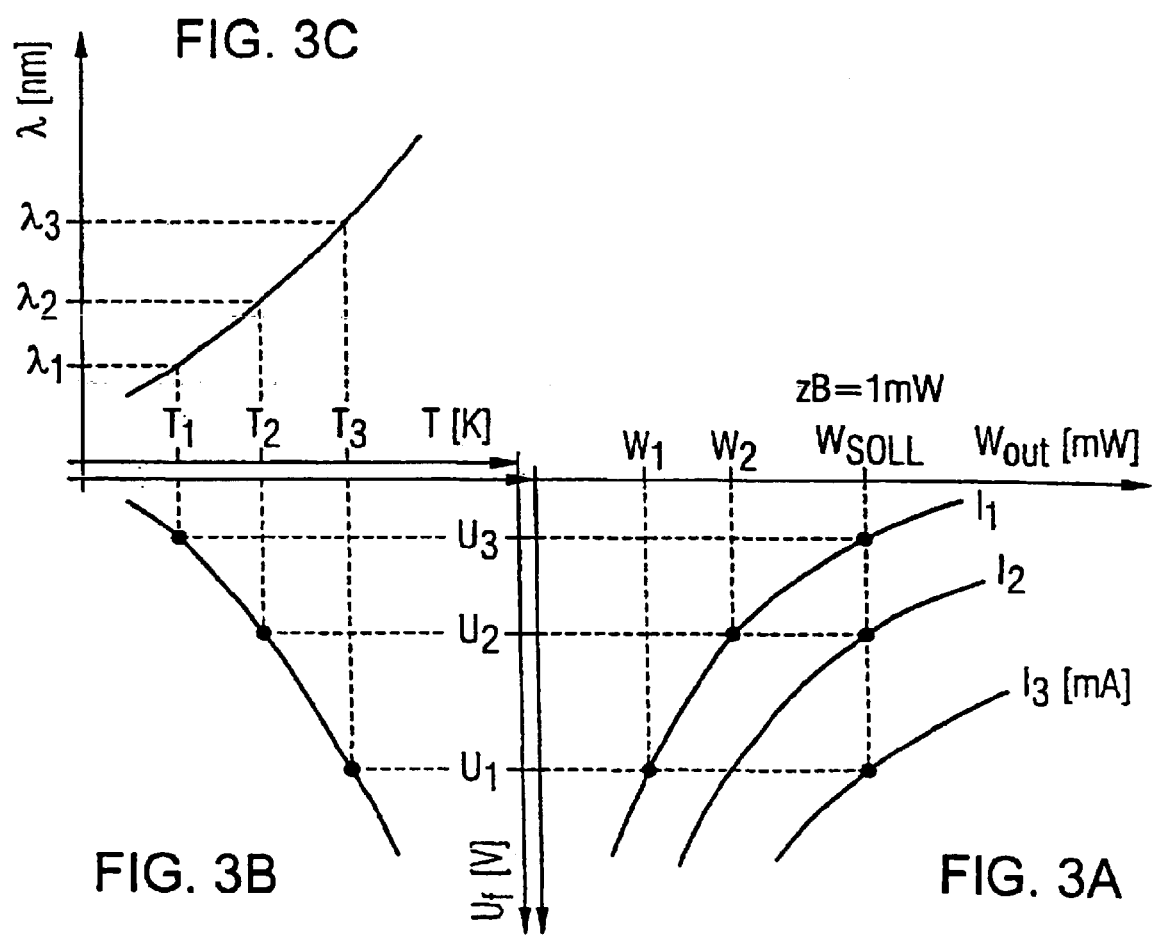

$T_1 \Rightarrow$ $I_1 \rightarrow I_1' \Rightarrow$ $T_1' \Rightarrow$

METHOD AND DEVICE FOR DETERMINING THE OUTPUT POWER OF A SEMICONDUCTOR LASER DIODE

CROSS-REFERENCE TO RELATED APPLICATION

This application is a continuation of copending International Application No. PCT/DE01/02998, filed Aug. 8, 2001, which designated the United States and was not published in English.

BACKGROUND OF THE INVENTION

Field of the Invention

Method and device for determining the output power of a semiconductor laser diode that is operated with a diode current.

It is generally known that the output power and the wavelength of the light of a semiconductor laser diode (HLD) are a function of temperature.

In particular, however, it is of decisive importance in optical telecommunications engineering that the output power and wavelength of the light pulses of the used semiconductor laser diode be kept as constant as possible in a very narrow tolerance range. In systems that are operated, for example, using the so-called dense wavelength-division multiplexing (DWDM) method, the spacing between the individual signal channels is only 0.8 nm.

Two preconditions must be fulfilled if both the wavelength and the output power of the light from the semiconductor laser diode are to be stabilized. The first requisite precondition consists in operating the semiconductor laser diode with a constant diode current. Detuning the diode current would lead not only to a change in the output power, but also to a temperature change of the laser-active pn-junction, and would thus entail detuning the wavelength of the light from the semiconductor laser diode.

Following directly from this is the second requisite precondition, namely the stabilization of the temperature of the laser-active region of the semiconductor laser diode.

Various control methods are known for this purpose from the prior art.

One possibility consists in determining the temperature of the semiconductor laser diode with a PTC thermistor or temperature sensor that is arranged in the vicinity of the laser chip, for example, at the edge of the housing of the semiconductor laser diode. The signal generated by the sensor can then, for example, serve for controlling a Peltier element with which the semiconductor laser diode is in thermal contact.

The decisive parameter is, however, the temperature of the laser-active region of the semiconductor laser diode, which can deviate significantly (for example up to 40° C.) from the measured temperature at the edge of the semiconductor laser diode, depending on the geometry of the semiconductor laser diode and the thermal ambient conditions. The essential disadvantage of this indirect measuring method consists in that the semiconductor laser diode can certainly have the same edge temperature for different ambient conditions and diode currents. However, in this case different temperatures can certainly prevail in the laser-active region of the semiconductor laser diode such that the semiconductor laser diode has a different output power and wavelength in conjunction with identical control signals.

A further disadvantage of this method is based on the fact that after a change in the temperature of the Peltier element, the new thermal equilibrium of the semiconductor laser diode is set up only by a certain time constant. For this reason, the control is subject to this time constant, and this can lead to problems with regard to the stability of the temperature control, particularly in the case of semiconductor laser diodes modulated at a high frequency.

A further possibility for temperature control consists in using a monitor diode to monitor the output power of a portion of the emitted light of the semiconductor laser diode. If the output power changes, the measured change signal is output to a control loop. This method certainly has the advantage that changes in the temperature of the laser-active region can be detected without a thermal time constant at the monitor diode, but it is technically complicated and expensive as a function of the operating state of the laser and of applied modulation methods, since it is necessary to integrate an additional measuring diode optically and electronically in the system.

SUMMARY OF THE INVENTION

It is accordingly an object of the invention to provide a method and a device for simply and precisely determining the output power of a semiconductor laser diode, which overcome the above-mentioned disadvantages of the prior art apparatus and methods of this general type, and which do not require a monitor diode.

With the foregoing and other objects in view there is provided, in accordance with the invention, a method for determining an output power of a semiconductor laser diode being operated with a diode current. The method includes steps of: conducting a defined measuring current through the semiconductor laser diode in a forward direction, the measuring current being smaller than a threshold current of the semiconductor laser diode; measuring a forward voltage being dropped across the semiconductor laser diode as a result of the measuring current; and using at least one calibration curve to determine the output power of the semiconductor laser diode from the forward voltage that was measured.

With the foregoing and other objects in view there is also provided, in accordance with the invention, a measuring device for determining an output power of a semiconductor laser diode being operated with a diode current. The measuring device includes: a device for generating a defined constant measuring current; a device for detecting the forward voltage being dropped across the semiconductor laser diode when the defined measuring current is conducted in the forward direction through the semiconductor laser diode; and a device for determining the output power of the semiconductor laser diode from the forward voltage that is measured and at least one calibration curve.

Accordingly, the method provides that the semiconductor laser diode, which is operated with a defined diode current, is used to conduct a defined measuring current Im, which is smaller than the threshold current of the semiconductor laser diode, in the forward direction through the semiconductor laser diode, to measure the forward voltage drop in this case across the semiconductor laser diode, and to determine the output power of the semiconductor laser diode from the measured forward voltage using at least one calibration curve.

The method proposes a novel approach in measuring the output power of a semiconductor laser diode, since the determination of the output power is performed not via additional measuring elements, but via the physical semiconductor property of the temperature dependence of the forward voltage of the semiconductor laser diode. In this case, use is made of the physical effect that the forward voltage of a semiconductor laser diode varies with the temperature of the laser-active region of the semiconductor laser diode when the semiconductor laser diode is operated with a constant measuring current that flows in the forward direction and that is below the threshold current. The output power of the semiconductor laser diode likewise varies with temperature.

The exact temperature dependence of the forward voltage and thus also the functional dependence of the forward voltage on the respective output power is determined for a semiconductor laser diode, individually by using calibration curves that are recorded. There is a need to record a specific calibration curve in each case for a multiplicity of different diode currents. This family of the calibration curves required for using the semiconductor laser diode is preferably already determined by the module manufacturer and is stored in a storage device of the module.

Because of the circumstance that additional measuring elements such as monitor diodes are not required to determine the output power, this is additionally a simple and cost effective solution.

Using the data from the family of characteristic curves which represent the relationship between the forward voltage and the output power of the semiconductor laser diode for a multiplicity of different diode currents, the output power of the laser-active region of the semiconductor laser diode can be determined precisely at any time solely by measuring the forward voltage.

The operation of the semiconductor laser diode is preferably interrupted for the measurement of the forward voltage. The interruption is short and is typically approximately one microsecond. In the course of the duration of the interruption, a measuring interval is present in which only the constant measuring current flows through the semiconductor laser diode and the forward voltage drop across the semiconductor laser diode is measured. Only a short interruption is sensible in this case in order, on the one hand, to interrupt the data transmission only briefly, and on the other hand, not to cause any cooling of the semiconductor laser diode because of the interrupted operation.

The interruptions are preferably performed at regular intervals. The temporal spacing of such measuring intervals should be governed in this case by the rates of change and the probabilities of change of the ambient temperature, and can lie between approximately 1 second and more than one hour.

It is advantageous when the measuring current used is as low as possible, that is to say lies in the range of a few milliamperes, such that any heat produced does not lead to falsification of the measurement result.

The determined output power of the semiconductor laser diode is preferably fed as a controlled variable to a control device for controlling the output power of the semiconductor laser diode. The control can be performed in this case as a function of the respective technical requirements both regarding the diode current and regarding an externally variable temperature of the semiconductor laser diode.

When the output power of the semiconductor laser diode operated with a first diode operating current is controlled by means of the diode current thereof, in the event of a deviation of the determined actual value of the forward voltage, and thus of the associated actual output power from the associated desired value from the family of the characteristic curves, a determination is made of the diode current value, to be adjusted anew, that corresponds in the case of the determined forward voltage to the desired value of the output power.

The temperature of the semiconductor laser diode is not kept constant in this type of control, and this can lead to fluctuations in the frequency of the emitted laser light. If frequency fluctuations occurring during the previously described control are not acceptable, it is necessary to control the output power of the emitted light additionally or exclusively by means of the temperature of the semiconductor laser diode. The semiconductor laser diode can be coupled for this purpose to a device for controlling the temperature, for example, to a Peltier element. The Peltier element is then driven in such a way that in the event of a deviation of the actual forward voltage from the desired forward voltage that corresponds to a permanently set diode operating current of the desired output power, the temperature of the Peltier element is increased in order to lower the forward voltage determined, or the temperature is appropriately lowered in order to increase the forward voltage determined to the desired value.

In a preferred refinement, the wavelength of the light emitted by the laser diode is determined in addition to the output power and/or the temperature of the laser diode by means of the measured forward voltage and using a calibration curve. Thus, the laser wavelength is a function of temperature, and the current wavelength can be determined via the forward voltage and the temperature, determined thereby, of the laser diode.

It is likewise conceivable to use the described principle exclusively for controlling the wavelength of the emitted light from the semiconductor laser diode. In this case, the characteristic curves would correspondingly have the relationship between the determined forward voltage and the frequency of the emitted light for a multiplicity of diode operating currents.

The measuring device for determining the output power of a semiconductor laser diode that is operated with a diode current has the following elements: a) a device for generating a defined, constant measuring current, b) a device for detecting a forward voltage that drops across a semiconductor laser diode through which the defined measuring current is conducted in the forward direction, and c) a device which determines the output power of the semiconductor laser diode from the measured forward voltage by using at least one calibration curve that is preferably specific to the diode current. The measuring device in this case executes the method explained above.

The measuring device preferably additionally has a control device that interrupts a laser operation of the semiconductor laser diode, and during the interruption, activates the device for generating a defined, constant measuring current such that the output power can be determined via the forward voltage of the semiconductor laser diode in the measuring interval of the interruption. It is preferred in this case for the control device to interrupt the laser operation of the semiconductor laser diode periodically.

The preferred use of the invention consists in that the determined output power of the semiconductor laser diode is fed as an actual value of the output power to a control circuit for controlling the output power and/or the wavelength of the emitted light of a semiconductor laser diode. In this case, the control circuit controls the output power of the semiconductor laser diode in the way previously described.

Other features which are considered as characteristic for the invention are set forth in the appended claims.

Although the invention is illustrated and described herein as embodied in a method and device for determining the output power of a semiconductor laser diode, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3A is a graph of three calibration curves that show the relationship between the forward voltage Uf and the output power for three different diode currents;

FIG. 3B is a graph of a calibration curve showing the relationship between the forward voltage Uf and the laser diode temperature;

FIG. 3C is a graph of a calibration curve showing the relationship between the laser wavelength and the laser diode temperature;

DESCRIPTION OF THE PREFERRED EMBODIMENTS

Figure 1:
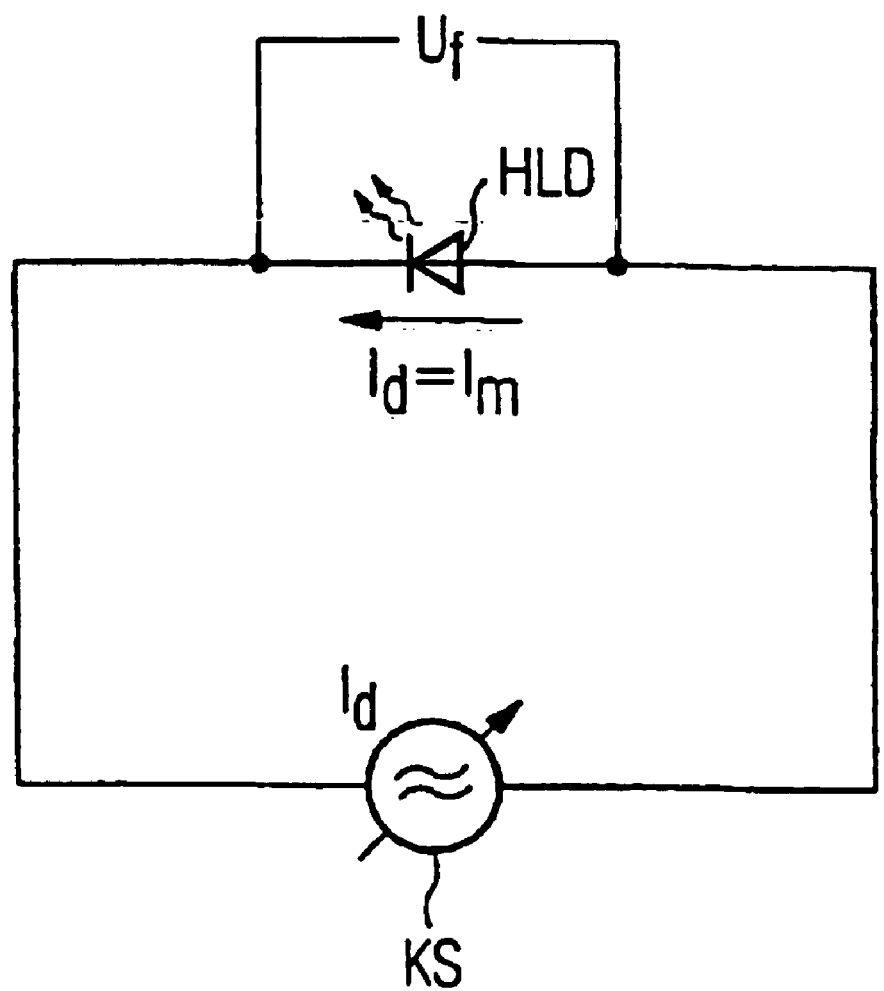
FIG. 1 is a schematic diagram of a circuit configuration with a semiconductor laser diode.

Referring now to the figures of the drawing in detail and first, particularly, to FIG. 1 thereof, there is schematically shown a circuit having a semiconductor laser diode HLD whose output power is to be determined. The semiconductor laser diode HLD is supplied with a diode current $I_d$ via a controllable constant-current source KS. The constant-current source KS is capable of providing various diode currents $I_d$. The semiconductor laser diode is preferably a VCSEL diode.

During the determination of the output power of the semiconductor laser diode HLD, a constant measuring current $I_m$ flows in the forward direction through the semiconductor laser diode HLD. The forward voltage Uf dropping across the semiconductor laser diode HLD is measured in this case.

Figure 2:
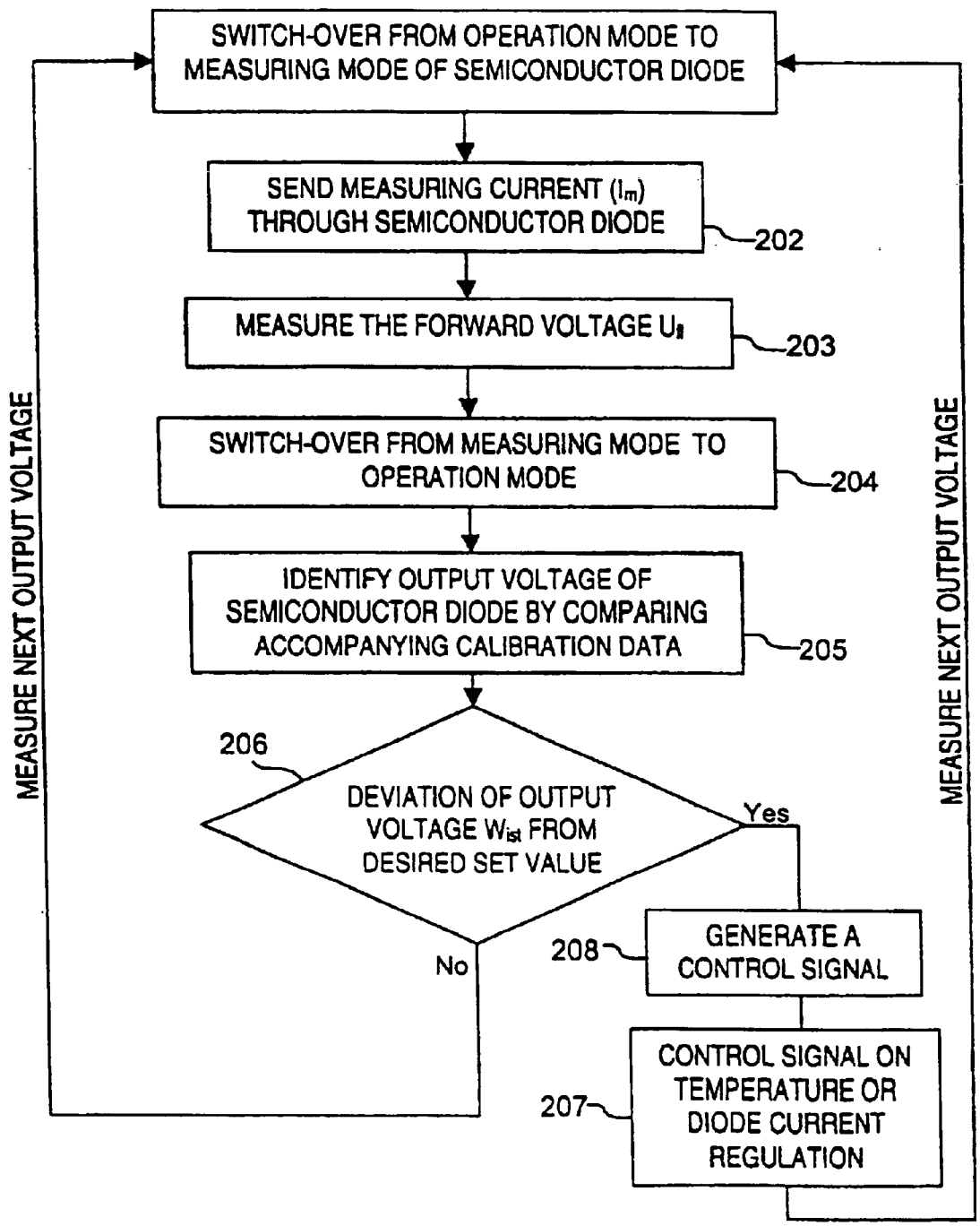
FIG. 2 is a flowchart of the inventive method for determining the output power.

FIG. 2 shows the steps in carrying out the measuring method. When the semiconductor laser diode HLD is in the operating mode, the first step requires the measuring mode to be activated. That is to say, the normal operation of the semiconductor laser diode HLD is interrupted and the measuring current $I_m$, which is lower than the threshold current of the semiconductor laser diode HLD, is set in the forward direction through the semiconductor laser diode HLD (steps 201, 202). Thereupon, the forward voltage Uf drop across the semiconductor laser diode HLD is measured (step 203). After the termination of this measurement, which lasts one microsecond, for example, the diode HLD is operated again with the operating diode current $I_b$ (step 204).

The output power of the semiconductor laser diode is determined (step 205) from the measured forward voltage Uf using a previously determined calibration curve or characteristic curve that is specific to the operating diode current $I_b$. The calibration curve specifies the forward voltage as a function of the output power of the semiconductor laser diode for the permanently prescribed measuring current $I_m$ and the defined operating diode current $I_b$.

In accordance with FIG. 2, the method is integrated in a control and regulating circuit for controlling the laser output power of a semiconductor laser diode. In this case, the determined actual value $W_{ist}$ of the output power of the semiconductor laser diode HLD is compared with a prescribed desired value (step 206). If the deviation between actual and desired values lies within a prescribed tolerance range, a renewed measurement of the output power is performed at a given time without a control signal being generated.

If the deviation of the measured output power lies outside the tolerance range, a control signal is generated that, for example, drives the diode current and/or the temperature of the semiconductor laser diode (steps 207, 208). Thereafter, the steps of the method are run through again in the next measuring interval that follows.

FIG. 3A shows by way of example three calibration curves that in each case represent, for different operating diode currents I1, I2 and I3, the relationship between the forward voltage Uf and the output power Wout of the semiconductor laser diode. The desired output power Wsoll is ensured in each case for the three different diode operating currents I1, I2, I3 when the forward voltage Uf has the associated values U1, U2 and U3.

The curvature of the curves for constant current values I1, I2, I3 is based on the temperature dependence of the WI (power-current) characteristic curve of a laser. In this case, the power W of a laser decreases with increasing temperature. With increasing temperature, the forward voltage Uf dropping across the semiconductor diode is also lowered in accordance with the laws governing semiconductors. Consequently, a lower forward voltage Uf is present with increasing temperatures, as illustrated in FIG. 3A.

The illustration of FIG. 3A shows by way of example the calibration curves of only three different diode operating currents. However, the module manufacturer records and stores a much larger number of calibration curves for correspondingly more diode operating currents. In this case, the intervals between the different operating currents are expediently selected to be so small that values lying therebetween can be interpolated linearly with sufficient accuracy.

The recorded calibration curves and the interpolated data permit the associated operating current to be determined quickly and reliably in relation to each forward voltage determined, in order to obtain the desired output power of the semiconductor laser diode.

FIG. 3B shows the temperature T of the laser-active region of the laser diode as a function of the forward voltage Uf. In this case, a specific temperature T1, T2, T3 of the laser diode corresponds respectively to different forward voltages U1, U2, U3. The associated calibration curve is determined before the operation of the laser and stored.

In accordance with FIG. 3C, it is also possible for the wavelength λ of the laser diode to be detected and/or set via the temperature of the laser diode. Thus, the wavelength λ of a laser diode is a function of temperature—a change in wavelength of 0.4 nm per Kelvin occurring as a rule. Thus, the wavelength λ of the laser diode can be detected and monitored, via the forward voltage Uf, by using a calibration curve that specifies the dependence of the wavelength on temperature.

In accordance with FIGS. 3A, 3B, 3C, a measured forward voltage U3 is assigned a current I1 in order to achieve a desired output power Wsoll of the laser diode. At the same time, the forward voltage U3 corresponds to a specific temperature T1 of the laser diode which, in turn, leads to a specific wavelength λ1. The desired output power is, for example, 1 mW, and the forward voltage is 1.8 volts.

In addition to or instead of the desired output power Wsoll, it is also possible to control the wavelength, depending on the application desired.

The calibration curves used permit the laser output power to be controlled in a simple fashion despite the complicated dependence of the laser output power Wout on the laser diode current and on the forward voltage, which depends, in turn, on the temperature.

The control response of FIG. 3A can also be explained in the following way. A specific temperature T of the semiconductor laser diode is determined via the forward voltage Uf. For this purpose, for example, a previously determined calibration curve is used that specifies the temperature of the laser-active region of the laser diode as a function of the forward voltage Uf. The determined temperature is assigned a specific WI (power-current) characteristic curve of the laser. A family of such characteristic curves are present and are stored in a control device. The current laser power W can be established for the determined temperature by using the associated WI characteristic curve and by using the present current. If the value of the current laser power W deviates from a desired value Wsoll, the laser diode current $I_b$ is changed accordingly.

A new measurement now yields a temperature T that is changed on the basis of the changed current and that is assigned another WI characteristic curve of the laser. This characteristic curve and the changed current are used to re-determine the current power W, and if the desired value Wsoll is not present, the laser diode current $I_b$ is controlled, etc. again until the control has led to the desired output power Wsoll.

Figure 6A:
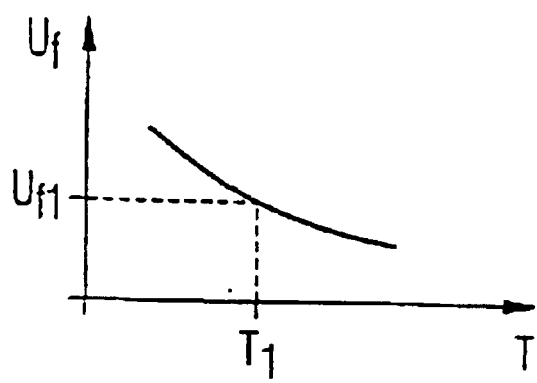
FIGS. 6A–6D are diagrams for explaining the method for controlling the output power.
Figure 6B:
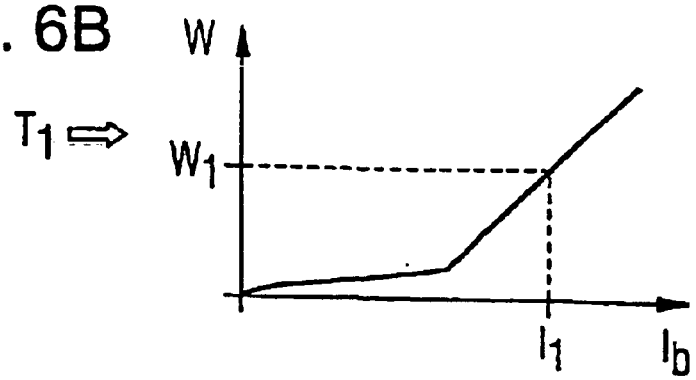
Figure 6C:
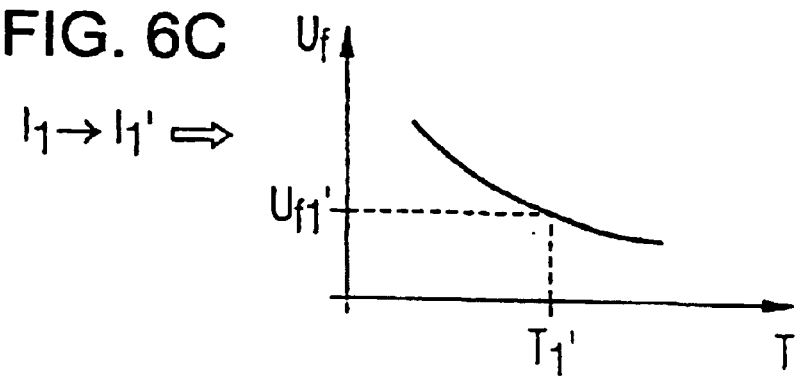
Figure 6D:
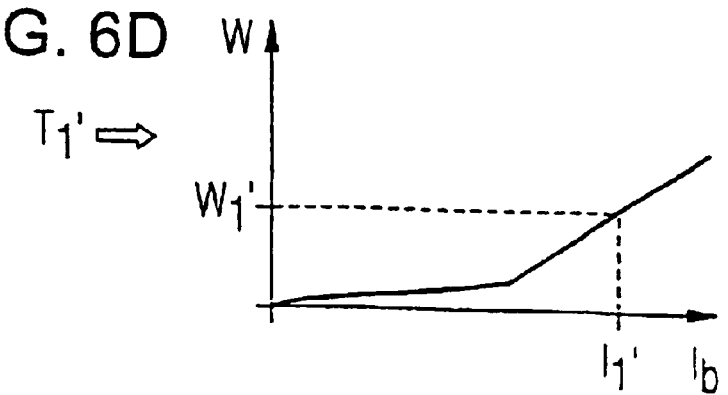

This is illustrated schematically in FIGS. 6A to 6B. FIG. 6A shows the dependence of the measured forward voltage Uf on the temperature T of the laser-active region of the semiconductor diode. A specific temperature T1 is yielded for a specific measured value Uf1. The temperature is assigned a specific WI characteristic curve (FIG. 6b) via which the current laser power W1 can be determined. A change in the diode current $I_b$ from I1 to I1' leads to a changed temperature T1' that is determined via a changed value UF1' of the forward voltage, and to another W1 characteristic curve that can be used to determine the changed laser power W1' (FIGS. 6c, 6d), etc., until the control has led to the desired output power Wsoll.

These steps are summarized via calibration curves shown in FIG. 3A such that it is possible to determine the associated operating current I immediately in relation to each determined forward voltage Uf in order to obtain the desired output power Wsoll of the semiconductor laser diode.

Figure 4A:
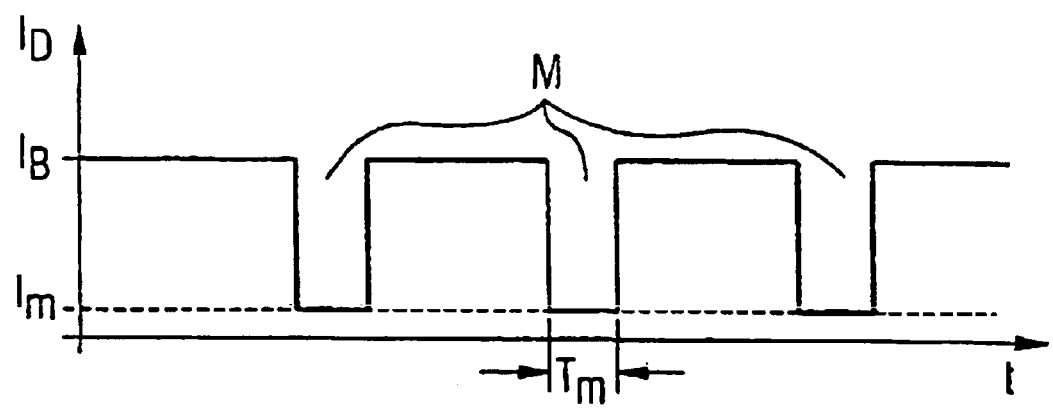
FIG. 4A shows a first temporal diode current variation of a semiconductor laser diode as the inventive method is being carried out.

The temporal variation of the diode current $I_d$ of a semiconductor laser diode is illustrated schematically in FIG. 4A. The output power of the semiconductor laser diode is measured in this case as described above. The diode current $I_d$ is equal to the diode operating current $I_b$ during the operating mode, and is equal to the measuring current $I_m$ during the periodically separated measuring intervals M, which respectively include a time period Tm. In this case, $I_b$ lies above the threshold current of the semiconductor laser diode, and $I_m$ lies below the threshold current. The time period Tm is typically approximately one microsecond. The temporal spacing between the measuring intervals M is determined by the given application and can lie between approximately 1 second and more than one hour.

Figure 4B:
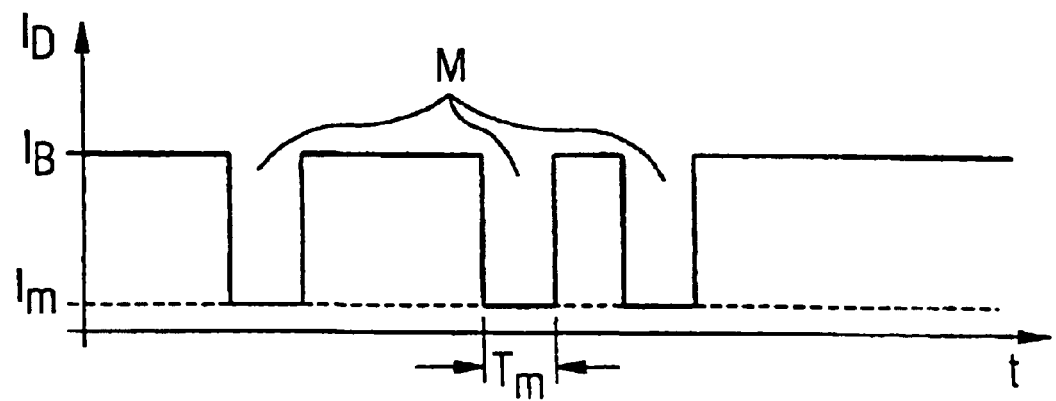
FIG. 4B shows a second temporal diode current variation of a semiconductor laser diode as the method is being carried out.

FIG. 4B illustrates that it is also possible for the measuring intervals M to be spaced apart non-periodically. A temperature measurement can be triggered in this case by external parameters, for example.

Figure 5A:
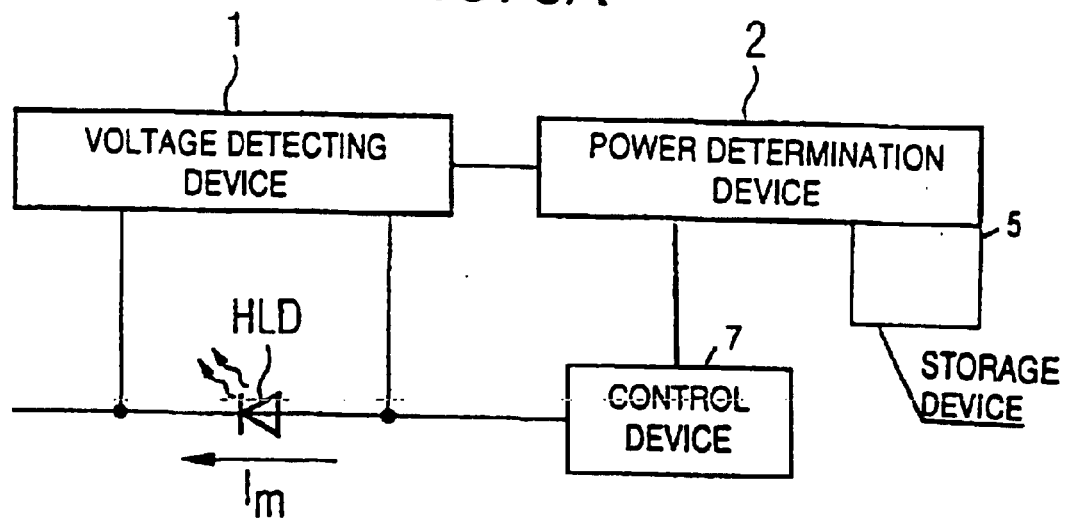
FIG. 5A is a schematic diagram of a first embodiment of a measuring device for determining the temperature of the laser-active region of a semiconductor laser diode.

FIG. 5A schematically shows a first embodiment of a measuring device for determining the output power of a semiconductor laser diode. A voltage detecting device 1 is provided that detects the forward voltage Uf drop across the semiconductor laser diode HLD during a measuring interval M.

Connected to the voltage detecting device 1 is a further device, namely an output power determination device 2, which uses the data of a prescribed calibration curve to determine the output power of the semiconductor laser diode HLD from the detected forward voltage. The output power determination device 2 can include a storage device 5 for storing further calibration curves, for example, relating to the dependence of the wavelength on the temperature of the laser diode or the forward voltage.

The output power determined is led to a control device 7 for controlling the output power of the semiconductor laser diode HLD, which controls the diode current $I_d$ provided by the controllable constant current source KS as a function of the actual value of the output power, and/or undertakes a changeover between the operating mode and the measuring mode.

Figure 5B:
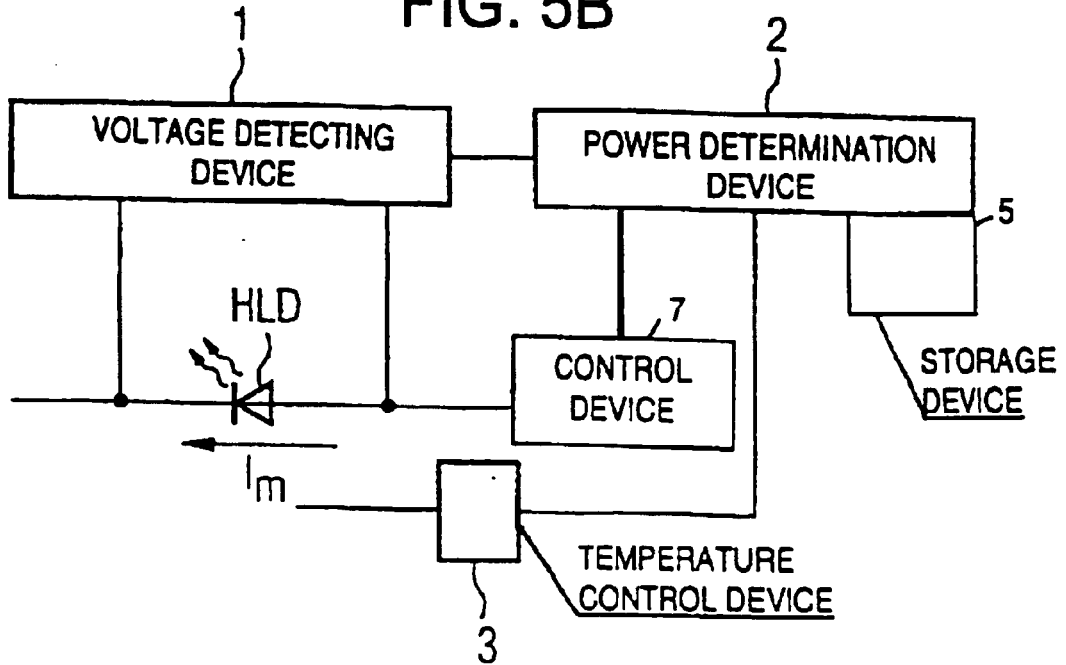
FIG. 5B is a schematic diagram of a second embodiment of a measuring device for determining the temperature of the laser-active region of a semiconductor laser diode.

FIG. 5B shows a second embodiment of a measuring device, which corresponds as much as possible to the measuring device shown in FIG. 5A. Identical components are therefore provided with identical reference symbols. By contrast with FIG. 5A, the semiconductor laser diode HLD has a temperature control device 3 that is thermally coupled thereto and ensures exclusively, or in conjunction with control of the diode current, that the desired output power of the semiconductor laser diode HLD is achieved. Such a temperature control device 3 is necessary, in particular, whenever there is a requirement to keep the frequency of the light emitted by the semiconductor laser diode HLD constant.

The devices 1 and 2 are to be understood in functional terms and can be implemented as software or hardware. It is also possible for the devices 1, 2 to be combined in a unit or to be designed as part of the control device for controlling the laser output power and/or the wavelength of the light emitted by the semiconductor laser diode.

We claim:

1. A method for determining an output power of a semiconductor laser diode being operated with a diode current, the method which comprises:

conducting a defined measuring current through the semiconductor laser diode in a forward direction, the measuring current being smaller than a threshold current of the semiconductor laser diode;

measuring a forward voltage being dropped across the semiconductor laser diode as a result of the measuring current; and using at least one calibration curve to determine the output power of the semiconductor laser diode from the forward voltage that was measured.

2. The method according to claim 1, which comprises providing a calibration curve representing a functional dependence between the forward voltage and the output power of the semiconductor laser diode given a constant diode current.

3. The method according to claim 1, wherein the step of measuring the forward voltage includes measuring the forward voltage within measuring time intervals during which a laser operation of the semiconductor laser diode is interrupted.

4. The method according to claim 1, wherein the measuring current is in a milliampere range.

5. The method according to claim 1, wherein the measuring current is as low as possible.

6. The method according to claim 1, which comprises feeding the output power, which has been determined, of the semiconductor laser diode to a control device for controlling the output power of the semiconductor laser diode.

7. The method according to claim 6, which comprises when the semiconductor laser diode is operated with a first diode operating current and when a measured value of the forward voltage deviates from a desired value of the forward voltage corresponding to a desired output power, then using a control device and calibration curves to determine a second diode operating current corresponding to the desired output power of the semiconductor laser diode.

8. The method according to claim 1, which comprises determining a wavelength of the semiconductor laser diode using the forward voltage that was measured and a calibration curve.

9. A measuring device for determining an output power of a semiconductor laser diode being operated with a diode current, the measuring device comprising:

a device for generating a defined constant measuring current;

a device for detecting a forward voltage being dropped across the semiconductor laser diode when the defined measuring current is conducted in the forward direction through the semiconductor laser diode; and a device for determining the output power of the semiconductor laser diode from the forward voltage that is measured and at least one calibration curve.

10. The measuring device according to claim 9, comprising a control device for interrupting a laser operation of the semiconductor laser diode, and during an interruption, activating said device for generating the defined constant measuring current.

11. The measuring device according to claim 10, wherein said control device periodically interrupts the laser operation of the semiconductor laser diode.

12. The measuring device according to claim 9, wherein said device for determining the output power includes a storage device storing specific characteristic curves relating a forward voltage and an output power for a multiplicity of diode currents.

13. The measuring device according to claim 12, wherein said storage device includes at least one specific characteristic curve for a relationship between temperature and wavelength of the semiconductor laser diode.

* * * * *